United States Patent
Zhou

(10) Patent No.: US 11,302,534 B2
(45) Date of Patent: Apr. 12, 2022

(54) SEMICONDUCTOR STRUCTURE WITH GATE DIELECTRIC LAYER AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 650 days.

(21) Appl. No.: 15/856,458

(22) Filed: Dec. 28, 2017

(65) Prior Publication Data

US 2018/0190497 A1 Jul. 5, 2018

(30) Foreign Application Priority Data

Dec. 30, 2016 (CN) .......................... 201611264859.9

(51) Int. Cl.
*H01L 21/28* (2006.01)
*H01L 29/66* (2006.01)
(Continued)

(52) U.S. Cl.
CPC .. *H01L 21/28114* (2013.01); *H01L 21/28158* (2013.01); *H01L 21/31127* (2013.01);
(Continued)

(58) Field of Classification Search
CPC ......... H01L 21/28114; H01L 21/28158; H01L 21/31127; H01L 21/76802;
(Continued)

(56) References Cited

U.S. PATENT DOCUMENTS 5,394,000 A * 2/1995 Ellul ................ H01L 27/10829
257/301
9,105,570 B2 * 8/2015 Su ........................ H01L 21/225
(Continued)

FOREIGN PATENT DOCUMENTS

| CN | 102468146 A | 5/2012 |
| CN | 104701150 A | 6/2015 |
| CN | 106024884 A | 10/2016 |

OTHER PUBLICATIONS

The European Patent Office (EPO) The Extended European Search Report for 17208754.6 dated Jun. 1, 2018 8 Pages.

*Primary Examiner* — Allen L Parker
*Assistant Examiner* — Charles N Ausar-El
(74) *Attorney, Agent, or Firm* — Anova Law Group, PLLC

(57) ABSTRACT

A semiconductor structure and a fabrication method are provided. The fabrication method includes forming a first dielectric layer on a base substrate, the first dielectric layer containing an opening exposing a surface portion of the base substrate; forming an initial gate dielectric layer on the surface portion of the base substrate and on a sidewall surface of the opening in the first dielectric layer; forming a gate dielectric layer by removing a portion of the initial gate dielectric layer from the sidewall surface of the opening, such that a top surface of the gate dielectric layer on the sidewall surface is lower than a top surface of the first dielectric layer; forming a gate electrode on the gate dielectric layer to fill the opening, a portion of the gate electrode being formed on a portion of the sidewall surface of the first dielectric layer; and forming a second dielectric layer on the gate electrode and on the first dielectric layer.

15 Claims, 8 Drawing Sheets

(51) Int. Cl.
  *H01L 21/311* (2006.01)
  *H01L 21/768* (2006.01)
  *H01L 29/423* (2006.01)
  *H01L 29/78* (2006.01)
(52) U.S. Cl.
  CPC .. *H01L 21/76802* (2013.01); *H01L 29/42376* (2013.01); *H01L 29/66545* (2013.01); *H01L 29/66795* (2013.01); *H01L 29/7851* (2013.01)
(58) Field of Classification Search
  CPC ......... H01L 29/42376; H01L 29/66545; H01L 29/66795; H01L 29/66606; H01L 29/66871
  USPC ......................................................... 257/288
  See application file for complete search history.

(56) References Cited

U.S. PATENT DOCUMENTS

| | | | | |
|---|---|---|---|---|
| 9,984,882 | B2 * | 5/2018 | Li | H01L 29/517 |
| 2006/0273411 | A1 * | 12/2006 | Triyoso | H01L 21/28202 |
| | | | | 257/410 |
| 2008/0272438 | A1 * | 11/2008 | Doris | H01L 29/6656 |
| | | | | 257/369 |
| 2011/0221012 | A1 * | 9/2011 | Bu | H01L 29/78 |
| | | | | 257/411 |
| 2012/0319198 | A1 | 12/2012 | Chien et al. | |
| 2013/0075827 | A1 * | 3/2013 | Lee | H01L 29/4966 |
| | | | | 257/369 |
| 2014/0264487 | A1 * | 9/2014 | Pham | H01L 29/78 |
| | | | | 257/288 |
| 2015/0214319 | A1 * | 7/2015 | Li | H01L 29/66606 |
| | | | | 257/288 |
| 2015/0255458 | A1 | 9/2015 | Ando et al. | |
| 2015/0270373 | A1 | 9/2015 | Horak et al. | |
| 2016/0049495 | A1 * | 2/2016 | Trevino | H01L 29/4966 |
| | | | | 257/410 |
| 2016/0225629 | A1 * | 8/2016 | Ando | H01L 21/022 |
| 2016/0293492 | A1 | 10/2016 | Fan et al. | |
| 2017/0186692 | A1 * | 6/2017 | Zhao | H01L 21/0214 |
| 2019/0027606 | A1 * | 1/2019 | Li | H01L 21/845 |
| 2020/0083334 | A1 * | 3/2020 | Cheng | H01L 29/401 |

* cited by examiner

SEMICONDUCTOR STRUCTURE WITH GATE DIELECTRIC LAYER AND FABRICATION METHOD THEREOF

CROSS-REFERENCES TO RELATED APPLICATIONS

This application claims the priority of Chinese patent application No. 201611264859.9, filed on Dec. 30, 2016, the entirety of which is incorporated herein by reference.

FIELD OF THE DISCLOSURE

The present disclosure generally relates to the field of semiconductor manufacturing technologies and, more particularly, relates to a semiconductor structure and a fabrication method thereof.

BACKGROUND

With continuous development of semiconductor technologies, the feature size of semiconductor devices continues to decrease. The reduction in feature size means that a larger number of transistors can be arranged on a single chip.

The high-K metal gate (HKMG) technology has become necessary for reducing the size of semiconductors. The HKMG formed by the post-gate technology has the advantages of lower power consumption, less leakage, and stable high-frequency operation state.

The threshold voltage is an important parameter for a transistor and often affects the switching performance of the transistor. In semiconductor technologies, the threshold voltage of a transistor needs to be strictly controlled.

However, the conventional fabrication method of a semiconductor structure can easily affect the threshold voltage of the formed semiconductor structure, and the performance of the formed semiconductor structure needs to be improved. The disclosed semiconductor structure and method are directed to solve one or more problems set forth above and other problems.

BRIEF SUMMARY OF THE DISCLOSURE

One aspect of the present disclosure provides a method for fabricating a semiconductor structure. The fabrication method includes forming a first dielectric layer on a base substrate, the first dielectric layer containing an opening exposing a surface portion of the base substrate; forming an initial gate dielectric layer on the surface portion of the base substrate and on a sidewall surface of the opening in the first dielectric layer; forming a gate dielectric layer by removing a portion of the initial gate dielectric layer from the sidewall surface of the opening, such that a top surface of the gate dielectric layer on the sidewall surface is lower than a top surface of the first dielectric layer; forming a gate electrode on the gate dielectric layer to fill the opening, a portion of the gate electrode being formed on a portion of the sidewall surface of the first dielectric layer; and forming a second dielectric layer on the gate electrode and on the first dielectric layer.

Another aspect of the present disclosure provides a semiconductor structure. The semiconductor structure includes a base substrate; a first dielectric layer on the base substrate and containing an opening exposing a surface portion of the base substrate; a gate dielectric layer having a thickness, on the surface portion of the base substrate and on a sidewall surface of the first dielectric layer in the opening, a top surface of the gate dielectric layer on the sidewall surface of the first dielectric layer being lower than a top surface of the first dielectric layer; a gate electrode on the gate dielectric layer in the opening and having a portion on a portion of the sidewall surface of the first dielectric layer; and a second dielectric layer on the first dielectric layer and on the gate electrode.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
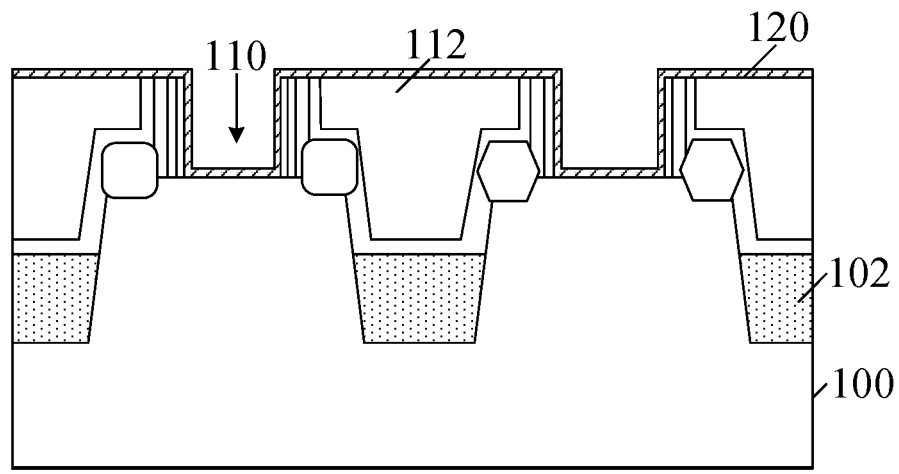
FIGS. 1~3 illustrate schematic structural views of a fabrication process of a semiconductor structure.
Figure 2:
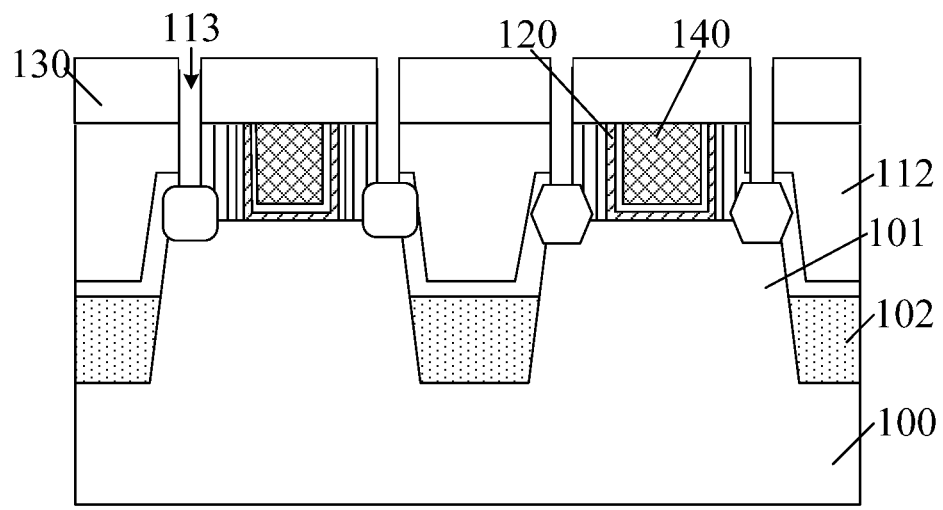
Figure 3:
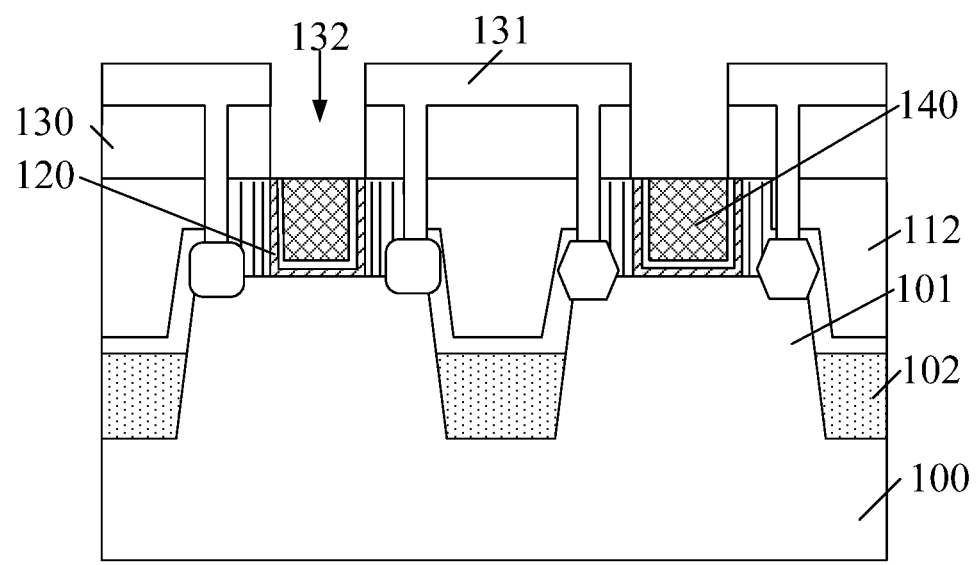

FIGS. 1 to 3 illustrate schematic structural views of a fabrication process of a semiconductor structure.

As shown in FIG. 1, a substrate 100 is provided, and the substrate 100 includes a first dielectric layer 112. The first dielectric layer 112 has openings 110, and a source/drain doped region is located in the substrate 100 on both sides of each opening 110. A gate dielectric layer 120 is formed on the bottom and sidewall surfaces of the openings 110.

As shown in FIG. 2, after forming the gate dielectric layer 120, gate electrodes 140 are formed in the openings 110 (as shown in FIG. 1). A second dielectric layer 130 is formed on the first dielectric layer 112, on the gate dielectric layer 120, and on the gate electrodes 140. First contact holes 113 are formed in the second dielectric layer 130 and the first dielectric layer 112. The first contact holes 113 expose the source/drain doped regions.

As shown in FIG. 3, second contact holes 132 are formed in the second dielectric layer 130, and the second contact holes 132 expose the gate electrodes 140. The second contact holes 132 are formed by the following process: forming a patterned layer 131 on the second dielectric layer 130, in which the patterned layer 131 exposes the portion of the second dielectric layer 130 on the gate electrodes 140; using the patterned layer 131 as a mask to etch the second dielectric layer 130 to form the second contact holes 132 in the second dielectric layer, with the second contact hole exposing the gate electrodes 140; and removing the patterned layer 131 after forming the second contact holes 132.

The second dielectric layer 130 may be made of silicon oxide. When forming the second dielectric layer, the oxygen atoms in the reactants tend to pass through the oxygen vacancies in the gate dielectric layer 120 into the portion of the gate dielectric layer 120 at the bottom of the openings 110, thereby affecting the threshold voltage of the formed semiconductor structure and thus affecting the performance of the formed semiconductor structure.

The patterned layer 131 may be an organic dielectric layer or an antireflective coating layer. Since the first contact hole 113 penetrates through the first dielectric layer 130 and the second dielectric layer 131, the depth of the first contact hole 113 is relatively large. Because the reactant for removing the patterned layer 131 contains oxygen gas and the reaction rate of the oxygen gas with the patterned layer 131 is relatively fast, the patterned layer 131 in the first contact holes 113 can be effectively removed. Further, since the gate electrode 140 has a relatively small size, the second dielectric layer 130 tends to expose the gate dielectric layer 120 when forming the second contact holes 132. When removing the patterned layer 131, the oxygen gas can directly contact with the gate dielectric layer 120. Therefore, the oxygen atoms in the oxygen gas can easily pass through the oxygen vacancies in the gate dielectric layer 120 into the gate dielectric layer 120 at the bottom of the openings 110, affecting the threshold voltage of the formed semiconductor structure and the performance of the formed semiconductor structure.

In the present disclosure, a base substrate is provided, and the base substrate includes a first dielectric layer. The first dielectric layer has openings, and the openings expose a portion of the surface of the base substrate. The disclosed fabrication method further includes forming an initial gate dielectric layer on the bottom and sidewall surfaces of the openings, with the top of the initial gate dielectric layer on the sidewall surface of the openings higher than or level with the surface of the first dielectric layer; etching the initial gate dielectric layer on the sidewall surface of the openings to make the top of the initial gate dielectric layer on the sidewall surface of the openings lower than the surface of the first dielectric layer, thereby forming a gate dielectric layer; forming gate electrodes on the gate dielectric layer to completely cover the gate dielectric layer; and forming a second dielectric layer on the gate electrode and on the first dielectric layer.

Since the gate electrode completely covers the gate dielectric layer, the reactant is not in direct contact with the gate dielectric layer during the formation of the second dielectric layer, thereby reducing diffusion of the oxygen atoms from the reactant to the gate dielectric layer. As a result, when forming the second dielectric layer, the influence of the oxygen atoms on the performance of the gate dielectric layer is reduced, and thus the threshold voltage of the formed semiconductor structure will not be affected.

Figure 16:
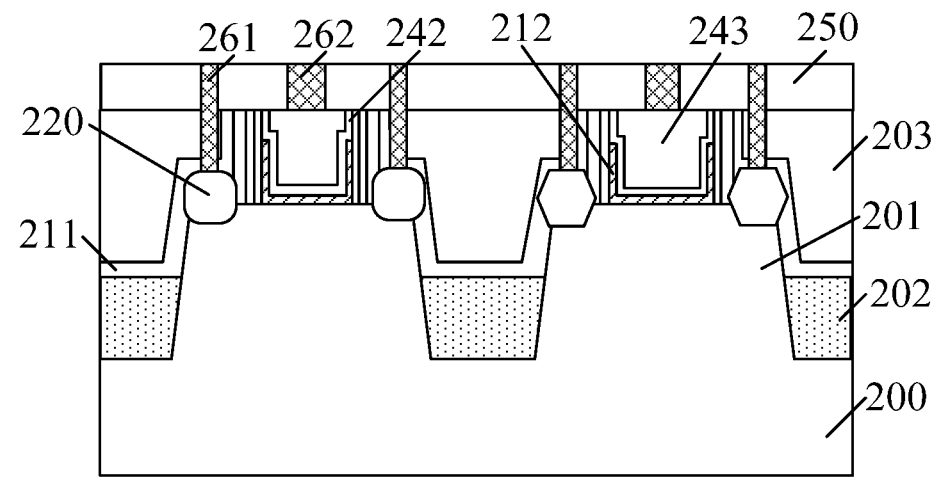
Figure 17:
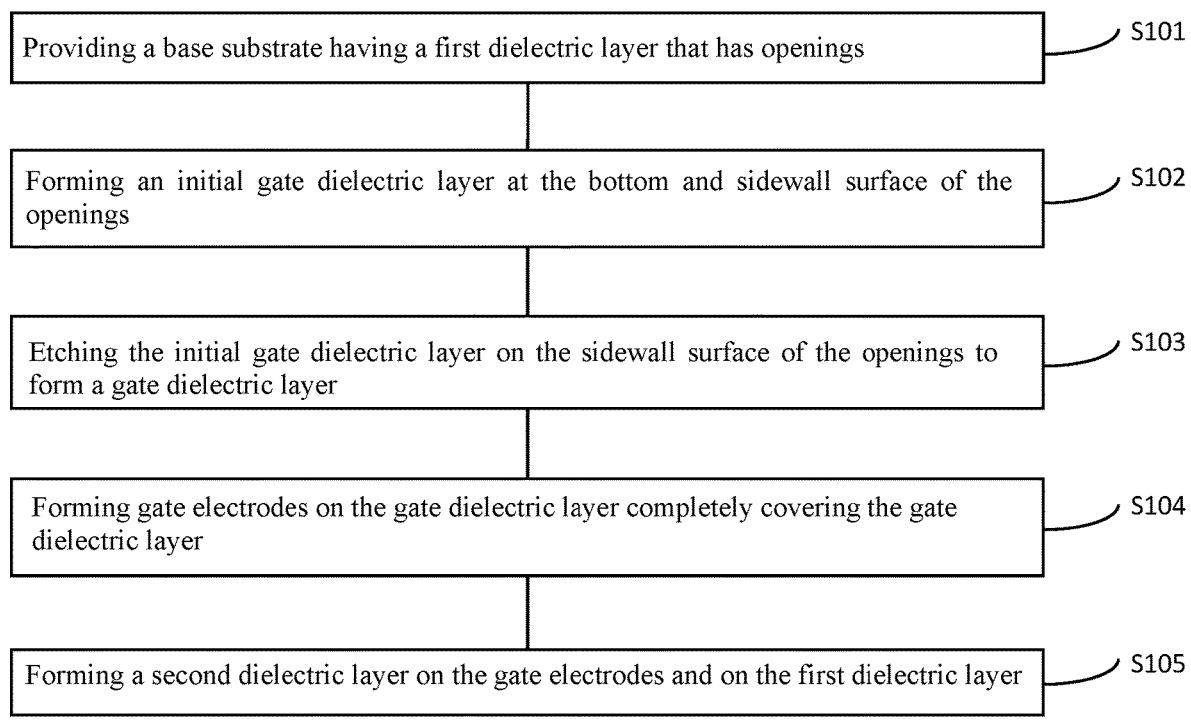
FIG. 17 illustrates an exemplary fabricating process of a semiconductor structure consistent with various disclosed embodiments.

FIG. 17 illustrates an exemplary fabrication process of a semiconductor structure consistent with various disclosed embodiments; and FIGS. 4-16 illustrate schematic structural views of semiconductor structures corresponding to certain stages of the exemplary fabrication process consistent with various disclosed embodiments.

As shown in FIG. 17, at the beginning of the fabrication process, a base substrate is provided, and the base substrate includes a first dielectric layer (S101). The first dielectric layer has openings, and the openings expose a portion of the surface of the base substrate.

Figure 4:
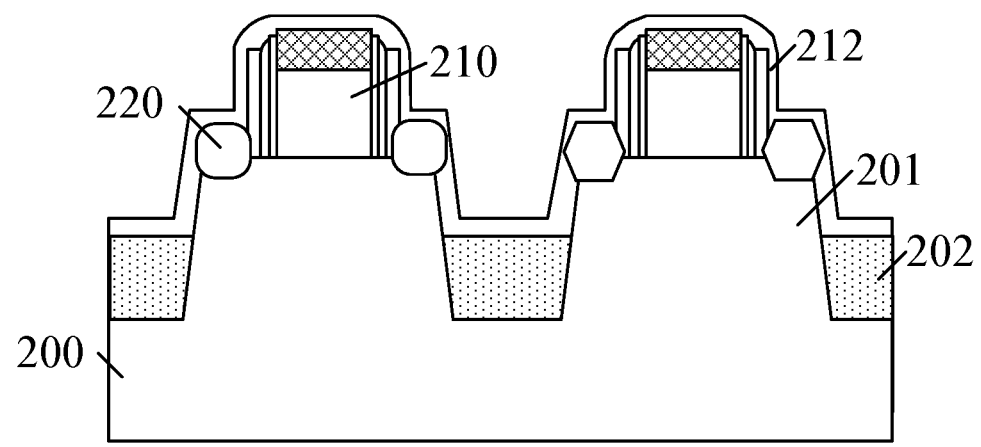
FIGS. 4~16 illustrate schematic structural views of an exemplary semiconductor structure corresponding to certain stages of a fabrication process consistent with various disclosed embodiments.
Figure 5:
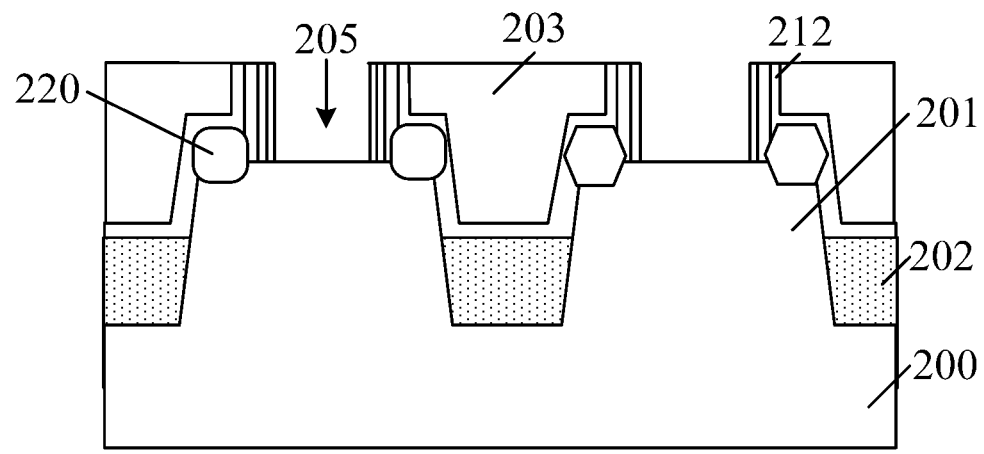

FIGS. 4 and 5 illustrate the process of forming the base substrate and the first dielectric layer according to some embodiments of the present disclosure.

As shown in FIG. 4, a base substrate is provided, and a plurality of dummy gate structures 210 is formed on the base substrate.

In one embodiment, the base substrate includes a substrate 200 and a plurality of fins 201 on the substrate 200. In other embodiments, the base substrate may also be a planar base substrate.

In one embodiment, the substrate 200 and the fins 201 are made of silicon. In other embodiments, the substrate and the fins may also be made of germanium or silicon germanium. In one embodiment, a source/drain doped region 220 is formed in the base substrate on both sides of the dummy gate structures 210. In one embodiment, the fabrication method further includes forming a stop layer 212 covering the top of the dummy gate structures 210. The stop layer 212 is used to control the subsequently-performed planarizing process of the initial first dielectric layer. In one embodiment, the stop layer 212 is made of silicon nitride. In other embodiments, the stop layer may also be made of silicon oxynitride.

As shown in FIG. 5, a first dielectric layer 203 is formed on the base substrate, and the first dielectric layer 203 covers the sidewall of the dummy gate structures 210.

In one embodiment, the first dielectric layer 203 is made of silicon oxide or silicon oxynitride.

In one embodiment, the process of forming the first dielectric layer 203 further includes forming an initial first dielectric layer on the base substrate, with the initial first dielectric layer covering the sidewall and top surfaces of the dummy gate structures 210; and planarizing the initial first dielectric layer to remove the portion of the initial first dielectric layer on top of the dummy gate structures 210 and forming a first dielectric layer 203. In one embodiment, the process of planarizing the initial first dielectric layer includes a chemical mechanical polishing process.

The dummy gate structures 210 are removed to form openings 205 in the first dielectric layer 230. The openings 205 are used to accommodate the subsequently formed gate electrodes. In one embodiment, the process of removing the dummy gate structures 210 includes a dry etching or wet etching process. In one embodiment, the first dielectric layer 203 also covers the surface of the source/drain doped regions 220.

Returning to FIG. 17, after providing the base substrate, an initial gate dielectric layer is formed (S102).

Figure 6:
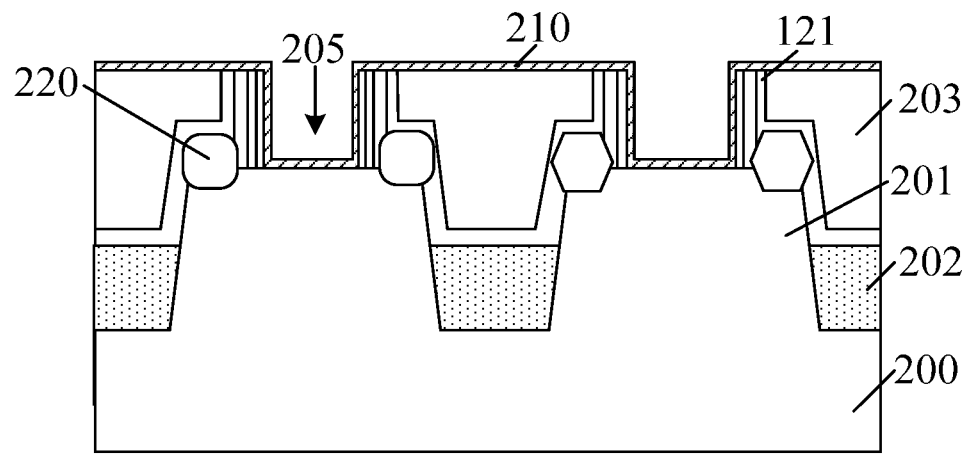

As shown in FIG. 6, an initial gate dielectric layer 210 is formed at the bottom and sidewall surfaces of the openings 205, and the top of the initial gate dielectric layer 210 on the sidewall surface of the openings 205 is higher or level with the surface of the first dielectric layer 230. In one embodiment, the initial gate dielectric layer 210 is formed at the bottom and sidewall surfaces of the openings 205, and on the first dielectric layer 203. In one embodiment, the initial gate dielectric layer 210 includes a gate oxide layer at the bottom and sidewall surfaces of the openings 205 and on the first dielectric layer 203; and a high-K dielectric layer on the gate oxide layer. In other embodiments, the initial gate dielectric layer may also include only a gate oxide layer or a high K (K>3.9) dielectric layer. In one embodiment, the gate oxide layer is made of silicon oxide, and the high-K dielectric layer may be made of one or more of $HfO_2$, $La_2O_3$, HfSiON, $HfAlO_2$, $ZrO_2$, $Al_2O_3$ or $HfSiO_4$.

In one embodiment, the process of forming the gate oxide layer may include a chemical vapor deposition process, a physical vapor deposition process, or an atomic layer deposition process. In one embodiment, the process of forming the high-K dielectric layer may include a chemical vapor deposition process, a physical vapor deposition process, or an atomic layer deposition process.

Returning to FIG. 17, after forming the initial gate dielectric layer, the fabrication method further includes etching the initial gate dielectric layer to form a gate dielectric layer (S103).

The initial gate dielectric layer 210 on the sidewall surface of the openings 205 is subsequently etched to make the top surface of the initial gate dielectric layer 210 on the sidewall surface of the openings 205 lower than the surface of the first dielectric layer 203, forming a gate dielectric layer.

FIGS. 7 to 11 illustrate the process of etching the initial gate dielectric layer 210 on the sidewall surface of the openings 205. A sacrificial layer is formed subsequently in the openings 205, and the surface of the sacrificial layer is lower than the surface of the first dielectric layer 203. A protective layer is formed between the sacrificial layer and the initial gate dielectric layer 210. In other embodiments, the protective layer may not need to be formed. FIGS. 7 to 10 illustrate the process of forming the sacrificial layer and the protective layer.

Figure 7:
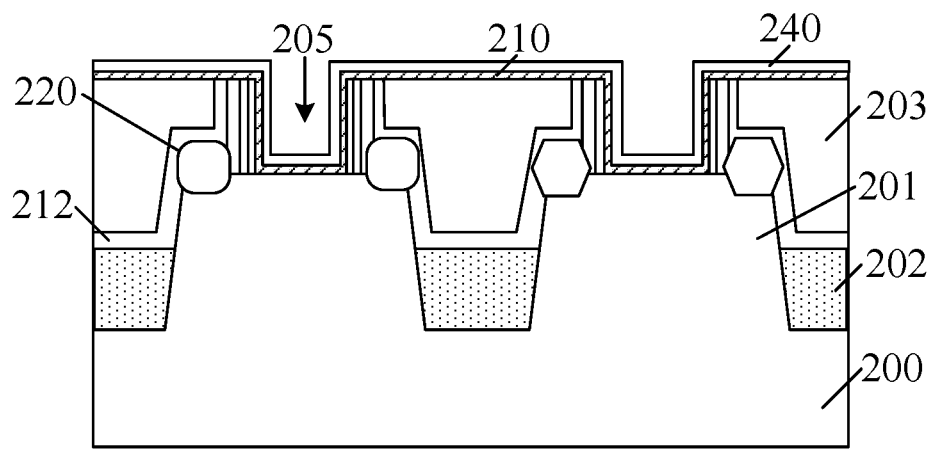

As shown in FIG. 7, an initial protective layer 240 is formed on the surface of the initial gate dielectric layer 210. The initial protective layer 240 is used to protect the initial gate dielectric layer 210 during the subsequent removal of the sacrificial layer and to the loss of the gate dielectric layer. The initial protective layer 240 and the initial gate dielectric layer 210 are made of different materials. In one embodiment, the initial protective layer 240 and the high-K dielectric layer are made of different materials. By using a different material for the initial protective layer 240 and the initial gate dielectric layer 210, the loss of the initial gate dielectric layer 210 can be reduced when removing the initial protective layer 240.

In one embodiment, the initial protective layer 240 is made of an amorphous silicon. In other embodiments, the initial protective layer may also be made of one or more of amorphous germanium, amorphous silicon germanium or silicon nitride. In one embodiment, the process of forming the initial protective layer 240 includes a chemical vapor deposition process or an atomic layer deposition process.

If the thickness of the initial protective layer 240 is too small, the initial gate dielectric layer 210 is not sufficiently protected. If the thickness of the initial protective layer 240 is too large, the difficulty of subsequently removing the protective layer is increased. For example, the thickness of the initial protective layer 240 may be in a range of approximately from 30 nm to 100 nm, e.g., about 50 nm.

Figure 8:
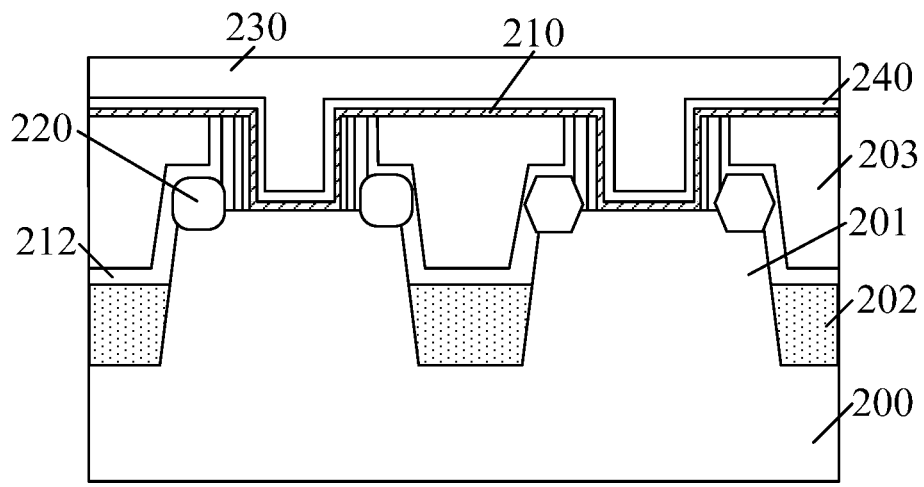

As shown in FIG. 8, after forming the initial protective layer 240, an initial sacrificial layer 230 is formed in the openings 205 and on the first dielectric layer 203. The initial sacrificial layer 230 is used to form a sacrificial layer. In one embodiment, the initial sacrificial layer 230 may be made of an organic dielectric layer or an antireflective coating layer. The organic dielectric layer or the anti-reflective coating layer can sufficiently fill up the openings 205 and adequately protect the initial gate dielectric layer 210 when subsequently etching the initial gate dielectric layer 210. In one embodiment, the process of forming the initial sacrificial layer 230 includes a spin coating process.

Figure 9:
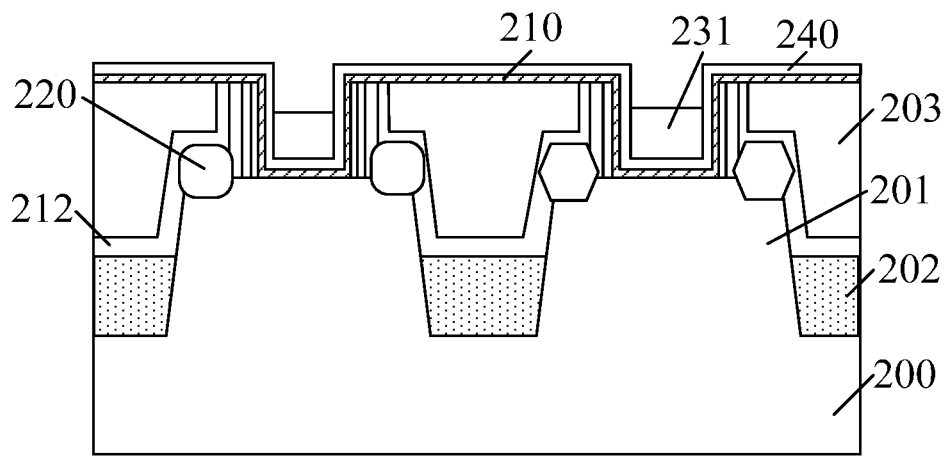

As shown in FIG. 9, the initial sacrificial layer 230 is etched to make the surface of the initial sacrificial layer 230 lower than the surface of the first dielectric layer 203, forming a sacrificial layer 231. The sacrificial layer 231 is used to protect the initial gate dielectric layer 210 at the bottom of the openings 205 when subsequently etching the initial gate dielectric layer 210. In one embodiment, the process of etching the initial sacrificial layer 230 includes a dry etching process.

Figure 10:
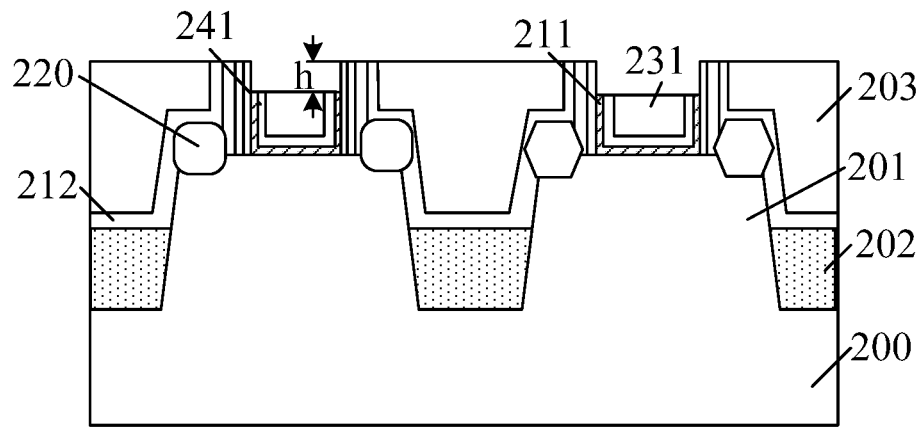

As shown in FIG. 10, the initial protective layer 240 is etched using the sacrificial layer 231 as a mask, such that the surface of the initial protective layer 241 is lower than the surface of the first dielectric layer 203, forming the protective layer 241. The protective layer 241 is used to protect the initial gate dielectric layer 210 when subsequently removing the sacrificial layer 231. In one embodiment, the process of etching the initial protective layer 240 includes a wet etching process or a dry etching process. In one embodiment, the thickness of the protective layer 241 is the same as the thickness of the initial protective layer 240. In one embodiment, the protective layer 241 and the initial protective layer 240 are made of the same material. For example, the protective layer 241 is made of amorphous silicon. In other embodiments, the protective layer may also be made of amorphous germanium, amorphous silicon germanium or silicon nitride.

As shown in FIG. 10, the initial gate dielectric layer 210 is etched using the sacrificial layer 231 and the protective layer 241 as a mask to make the surface of the initial gate dielectric layer 240 lower than the surface of the first dielectric layer 203, forming a gate dielectric layer 211. In one embodiment, the gate dielectric layer 211 and the initial gate dielectric layer 210 are made of the same material. In one embodiment, the process of etching the initial gate dielectric layer 240 includes a wet etching process or a dry etching process.

In one embodiment, the depth h of the gate dielectric layer 211 is the distance between the top of the gate dielectric layer 211 on the sidewall surface of the openings 205 and the surface of the first dielectric layer 203 along the direction perpendicular to the surface of the substrate 200. The depth of the protective layer 241 is the distance between the top of the protective layer 241 on the sidewall surface of the openings 205 and the surface of the first dielectric layer 203 along the direction perpendicular to the surface of the substrate 200.

The depth h of the gate dielectric layer 211 and the depth of the protective layer 241 are determined by the thickness of the sacrificial layer 231. If the thickness of the sacrificial layer 231 is too small, the initial gate dielectric layer 210 at the bottom of the openings 205 is not adequately protected; if the thickness of the sacrificial layer 231 is too large, the depth of the gate dielectric layer 211 and the protective layer 24 will be affected by the reactants for forming the second dielectric layer, thereby affecting the performance of the formed semiconductor structure. In one embodiment, the thickness of the sacrificial layer 231 is in a range of approximately from 400 Å to 800 Å, and the height of the first dielectric layer on the sidewall of the openings 205 is in a range of approximately from 400 Å to 100 Å. In one embodiment, the thickness of the gate dielectric layer 211 is in a range of approximately from 10 Å to 30 Å.

Figure 11:
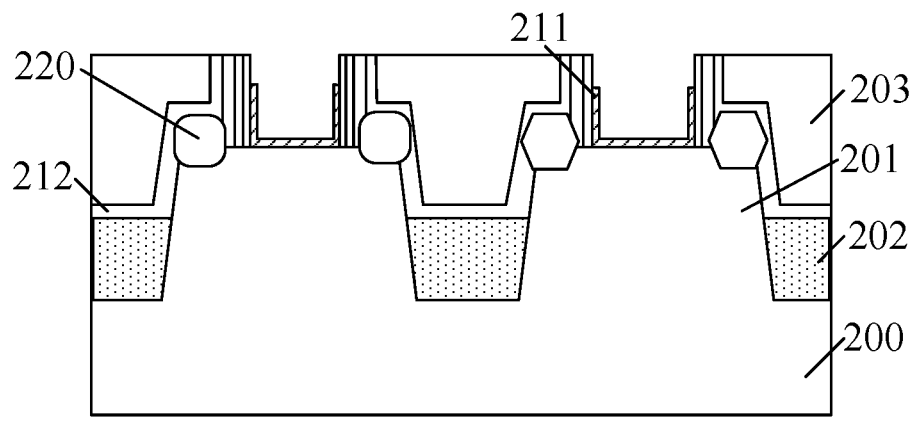

As shown in FIG. 11, after etching the initial gate dielectric layer 240, the sacrificial layer 231 is removed.

Since the depth of the openings 205 is relatively small, the reactants for removing the sacrificial layer 231 may be one or both of $H_2$ or $N_2$. $H_2$ or $N_2$ cannot easily affect the work function of the formed transistors, so that the threshold voltage of the formed semiconductor structure will not be affected. In one embodiment, the process of removing the sacrificial layer 231 includes an ashing process. In one embodiment, the process of removing the sacrificial layer 231 includes a first reaction gas of one or both of $H_2$ or $N_2$. In one embodiment, the protective layer 241 can reduce the contact area between the gate dielectric layer 211 and the first reaction gas when removing the sacrificial layer 231, such that the influence of the first reaction gas for removing the sacrificial layer 231 on the gate dielectric layer 211 can be further reduced, improving the performance of the formed semiconductor structure.

As shown in FIG. 11, after removing the sacrificial layer 231, the protective layer 241 is removed. In one embodiment, the process of removing the protective layer 241 includes a dry etching process or a wet etching process.

Returning to FIG. 17, the fabrication method further includes forming gate electrodes on the gate dielectric layer (S104).

Figure 12:
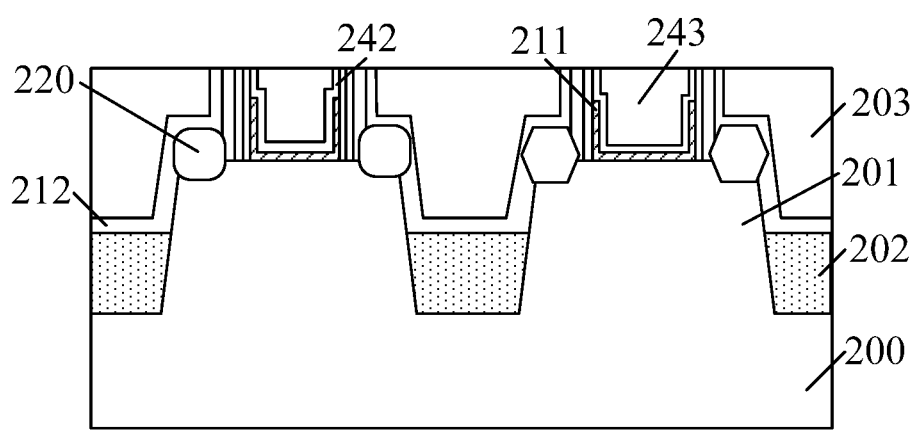

As shown in FIG. 12, after forming the gate dielectric layer 211, a work function layer 242 is formed on the gate dielectric layer 211. The work function layer 242 is used to adjust the threshold voltage of the formed semiconductor structure. In one embodiment, if the work function layer 242 is used to form a PMOS transistor, the work function layer 242 may be made of titanium oxide or titanium nitride; if the work function layer 242 is used to form an NMOS transistor, the work function layer 242 may be made of titanium or tantalum. In one embodiment, the process of forming the work function layer 242 includes a chemical vapor deposition process.

As shown in FIG. 12, gate electrodes 243 is formed on the gate dielectric layer 211, and the gate 243 completely covers the gate dielectric layer 211.

In one embodiment, after forming the work function layer 242, gate electrodes 243 are formed in the openings 205. In one embodiment, the surface of the gate electrodes 243 is level with the surface of the first dielectric layer 203. Since the top surface of the gate dielectric layer 211 is lower than the surface of the first dielectric layer 203, the gate electrodes 243 completely cover the gate dielectric layer 211. In one embodiment, the gate electrodes 243 are made of a metal, such as Al, Cu, Ag, Au, Ni, Ti, W, WN or WSi. In one embodiment, the process of forming the gate electrodes 243 includes a chemical vapor deposition process.

Returning to FIG. 17, after forming the gate electrodes on the gate dielectric layer, the fabrication method further includes forming a second dielectric layer on the gate electrodes and on the first dielectric layer (S105).

Figure 13:
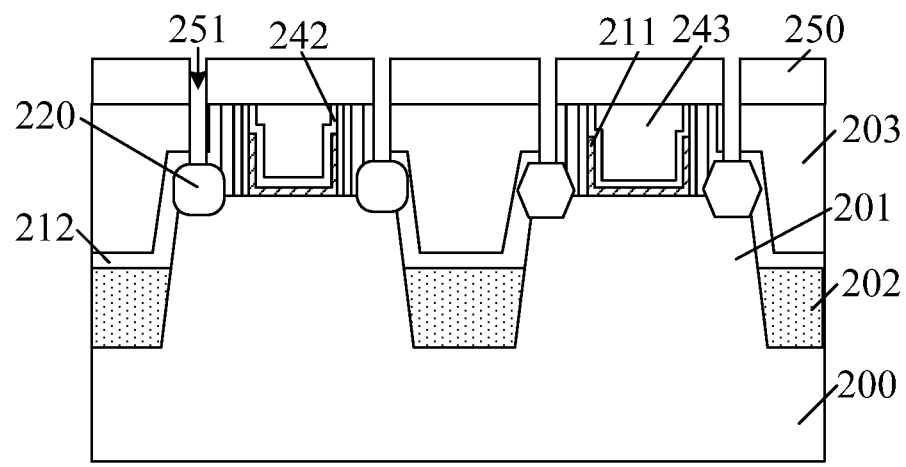

As shown in FIG. 13, a second dielectric layer 250 covering the base substrate and the gate electrodes 243 is formed. The second dielectric layer 250 is used to electrically insulating the formed transistor from the external circuit. In one embodiment, the second dielectric layer 250 is made of silicon oxide. Silicon oxide is a desirable insulator, and the bonding property between silicon oxide and the gate electrodes 243 and the first dielectric layer 203 is also desirable. Thus, the state density of the contact surface is low with few defects.

Since the gate electrodes 243 completely cover the gate dielectric layer 211, the second dielectric layer 250 does not contact with the gate dielectric layer 211 during the formation of the second dielectric layer 250. Thus, the oxygen atoms in the reactants for forming the second dielectric layer 250 cannot enter the gate dielectric layer 211, and the threshold voltage of the formed semiconductor structure will not be affected.

In one embodiment, the process of forming the second dielectric layer 250 includes a chemical vapor deposition process.

Still in FIG. 13, a first contact hole 251 is formed in the first dielectric layer 203 and in the second dielectric layer 250, and the first contact holes 251 expose the surface of the source/drain doped regions 220. The first contact holes 251 are used to subsequently accommodate the source/drain plugs. In one embodiment, since the thickness of the first dielectric layer 203 and the second dielectric layer 250 is relatively large and the size of the source/drain doped regions 220 is very small, the depth of the first contact holes 251 is relatively large.

Figure 14:
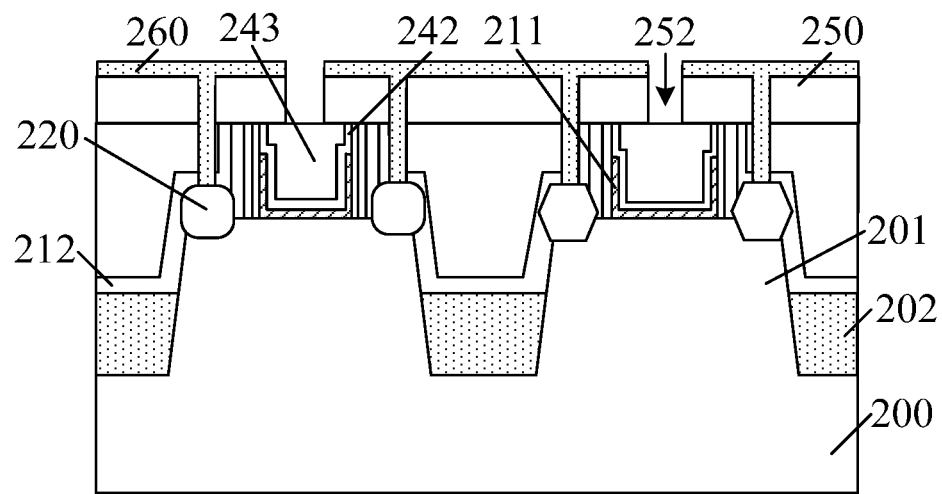

As shown in FIG. 14, a patterned layer 260 is formed in the first contact holes 251 and on the second dielectric layer 250, and the patterned layer 260 exposes the second dielectric layer 250 on the gate electrodes 242. The patterned layer 260 is used as a mask for etching the second dielectric layer 260 and planarizing the etched surface. Since the depth of the first contact holes 251 is relatively large, the patterned layer 260 needs to have very good gap filling capability. In one embodiment, the patterned layer 260 is made of an antireflective coating layer or an organic dielectric layer. In one embodiment, the process of forming the patterned layer 260 includes a spin coating process.

As shown in FIG. 14, the second dielectric layer 250 is etched using the patterned layer 260 as a mask, forming second contact holes 252 in the second dielectric layer 250. The second contact holes 252 expose the gate electrodes 243. The second contact holes 252 are used to subsequently accommodate the gate plugs. In one embodiment, the process of etching the second dielectric layer 250 includes a dry etching process or a wet etching process.

Figure 15:
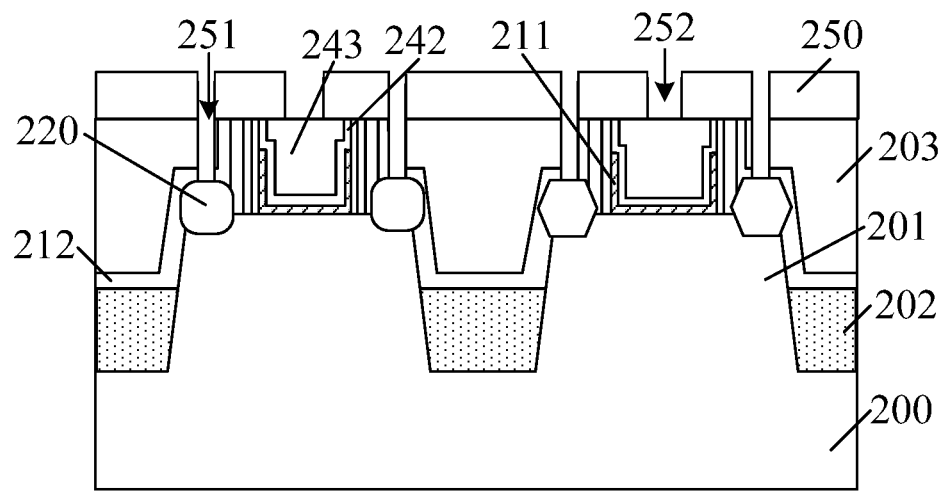

As shown in FIG. 15, after forming the second contact holes 252, the patterned layer 260 is removed.

If the patterned layer 260 in the first contact holes 251 is not completely removed, the amount of the remaining patterned layer 260 will be large enough to easily affect the performance of the formed semiconductor structure. In one embodiment, since the depth of the first contact holes 251 is relatively large, it is necessary to remove the patterned layer 260 by using the oxygen gas that has a relatively high reaction rate with the patterned layer 260. In particular, the process of removing the patterned layer 260 includes an ashing process, in which the second reaction gas is oxygen gas. The second reaction gas may also be one or both of the hydrogen or nitrogen gas.

Because the gate electrodes 243 completely cover the gate dielectric layer 211, the gate dielectric layer 211 does not contact with the second reaction gas when removing the patterned layer 260, the gate electrodes 243 can block the oxygen atoms in the second reaction gas from entering the gate dielectric layer 211 on the bottom surface of the openings 205 through the oxygen vacancies in the gate dielectric layer 211. Therefore, the influence of the second reaction gas on the gate dielectric layer 211 is reduced, which can further reduce the influence on the threshold voltage of the formed semiconductor structure and ensure the performance of the formed semiconductor structure.

As shown in FIG. 16, source/drain plugs 261 are formed in the first contact holes 251, and gate plugs 262 are formed in the second contact holes 252.

The source/drain plugs 262 are used to electrically connect the source/drain doped regions 220 and the external circuit, and the gate plugs 262 are used to electrically connect the gate electrodes 243 and the external circuit. In one embodiment, the source/drain plugs 261 and the gate plugs 262 are made of tungsten. In other embodiments, the source/drain plugs and the gate plugs may also be made of copper. In one embodiment, the process of forming the source/drain plugs 261 and the gate plugs 262 includes a chemical vapor deposition process.

As such, the gate electrode can completely cover the gate dielectric layer in the opening, and the subsequently-used reactant(s) for forming the second dielectric layer are not easily be in contact with the gate dielectric layer. Therefore, diffusion of the oxygen atoms from the reactants to the gate dielectric layer can be suppressed, and the effect of the oxygen atoms on the performance of the gate dielectric layer and thus on the threshold voltage of the formed semiconductor structure can be reduced when forming the second dielectric layer.

Also, since the depth of the first contact holes is relatively large, it is necessary to remove the patterned layer by the oxygen gas. As the gate electrodes completely cover the gate dielectric layer, the oxygen gas cannot easily be in contact with the gate dielectric layer when removing the patterned layer. As such, the oxygen atoms cannot easily pass through the oxygen vacancies in the gate dielectric layer and enter gate dielectric layer at the bottom of the openings, and thus cannot affect the performance of the gate dielectric layer. Therefore, the disclosed fabrication method can improve the performance of the formed semiconductor structure.

Further, a protective layer is formed between the initial gate dielectric layer and the sacrificial layer before etching the initial gate dielectric layer. The protective layer can protect the initial gate dielectric layer at the bottom of the openings when etching the initial gate dielectric layer, avoiding the reactant for removing the sacrificial layer to affect the performance of the gate dielectric layer, and improving the performance of the formed semiconductor structure.

Accordingly, the present disclosure also provides a semiconductor structure. As shown in FIG. 16, the semiconductor structure in the present disclosure includes a base substrate. The base substrate includes a first dielectric layer 203. The first dielectric layer has openings, and the openings expose a portion of the base substrate surface. The semiconductor structure further includes a gate dielectric layer 211 at the bottom surface of the openings, with the surface of the gate dielectric layer 211 lower than the surface of the first dielectric layer 203; gate electrodes 243 on the gate dielectric layer 211, with the gate electrodes 243 completely covering the gate dielectric layer 211; and a second dielectric layer 250 covering the base substrate and the gate electrodes 243.

The semiconductor structure further includes: source/drain doped regions 220 located in the base substrate on both sides of the openings; source/drain plugs 261 located in the first dielectric layer 203 and the second dielectric layer 250 and the source/drain plugs 261 being electrically connected to the source/drain doped regions 220; gate plugs 262 located in the second dielectric layer 250, and the gate plugs 262 being electrically connected to the gate electrodes 243.

In one embodiment, the base substrate includes a substrate 200 and a plurality of fins 201 located on the substrate 200. The semiconductor structure further includes an isolation structure 202 on the substrate 200, and the isolation structure 202 covers a portion of the sidewall and top surfaces of the fins 201.

In one embodiment, the semiconductor structure further includes a stop layer 212 between the gate dielectric layer 211 on the sidewall of the openings and the first dielectric layer 203.

In one embodiment, the substrate, the isolation structure 202, the stop layer 212, the source/drain doped region 220, the gate electrode 243, the gate dielectric layer 211, the first dielectric layer 203, and the second dielectric layer 250 are the same as those in the previous embodiment, and details will not be repeated here.

Therefore, the present disclosure provides a method for fabricating a FinFET to enhance the device stability. In an exemplary embodiment, the high K material is recessed before the metal gate process, and diffusion of O through the high K material is prohibited by forming gate electrodes completely covering the gate dielectric layer, which improves the performance of the formed semiconductor structure.

As such, in the semiconductor structure provided by the present disclosure, the gate electrode can completely cover the gate dielectric layer in the opening, and the subsequently-used reactant(s) for forming the second dielectric layer are not easily be in contact with the gate dielectric layer. Therefore, diffusion of the oxygen atoms from the reactants to the gate dielectric layer can be suppressed, and the effect of the oxygen atoms on the performance of the gate dielectric layer can be reduced when forming the second dielectric layer. The fabrication method in the present disclosure does not affect the work function of the formed semiconductor structure, and thus does not affect the threshold voltage of the formed semiconductor structure.

Compared with conventional technologies, the fabrication method in the present disclosure is advantageous.

In the disclosed method of forming a semiconductor structure, the gate electrode can completely cover the gate dielectric layer in the opening, and the subsequently-used reactant(s) for forming the second dielectric layer are not easily be in contact with the gate dielectric layer. Therefore, diffusion of the oxygen atoms from the reactants to the gate dielectric layer can be suppressed, and the effect of the oxygen atoms on the performance of the gate dielectric layer and thus on the threshold voltage of the formed semiconductor structure can be reduced when forming the second dielectric layer.

Also, since the depth of the first contact holes is relatively large, it is necessary to remove the patterned layer by an oxygen gas. In the meantime, since the gate electrodes completely cover the gate dielectric layer, the oxygen gas cannot easily contact with the gate dielectric layer when removing the patterned layer, and the oxygen atoms cannot easily pass through the oxygen vacancies in the gate dielectric layer into the bottom of the openings and thus cannot easily affect the performance of the gate dielectric layer. Therefore, the fabrication method can improve the performance of the formed semiconductor structure.

Further, a protective layer is formed between the initial gate dielectric layer and the sacrificial layer before etching the initial gate dielectric layer. The protective layer can protect the initial gate dielectric layer at the bottom of the openings when etching the initial gate dielectric layer, avoiding the adverse effect of the reactant for removing the sacrificial layer on the performance of the gate dielectric layer, and further improving the performance of the formed semiconductor structure.

In the semiconductor structure provided by the technical solution of the present disclosure, the gate electrodes completely cover the gate dielectric layer, and the reactant is not easily in contact with the gate dielectric layer during the formation of the second dielectric layer. Thereby, the diffusion of the oxygen atoms into the gate dielectric layer is suppressed, and the adverse effect of the oxygen atoms in the process of forming the second dielectric layer on the performance of the second gate dielectric layer is reduced. Therefore, the fabrication method does not easily affect the threshold voltage of the formed semiconductor structure.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
   forming a first dielectric layer on a base substrate, wherein the first dielectric layer contains an opening exposing a surface portion of the base substrate;
   forming an initial gate dielectric layer on the first dielectric layer, the surface portion of the base substrate and on a sidewall surface of the opening in the first dielectric layer;
   forming an initial protective layer completely covering the initial gate dielectric layer on the first dielectric layer, the surface portion of the base substrate and on the sidewall surface of the opening in the first dielectric layer;
   forming a sacrificial layer in the opening and on the initial protective layer, the sacrificial layer having a top surface lower than a top surface of the first dielectric layer;
   forming a gate dielectric layer and a protective layer by using the sacrificial layer as a mask to etch a portion of the initial gate dielectric layer from the sidewall surface of the opening and a portion of the initial protective layer from the sidewall surface of the opening, such that a top surface of the gate dielectric layer on the sidewall surface and a top surface of the protective layer on the gate dielectric layer are lower than a top surface of the first dielectric layer, and a top surface of the first dielectric layer is exposed;
   removing the sacrificial layer and the protective layer, wherein: the protective layer is sandwiched between the gate dielectric layer and the sacrificial layer before the protective layer and the sacrificial layer are removed;
   forming a gate electrode on the gate dielectric layer to fill the opening, wherein a portion of the gate electrode is formed on a portion of the sidewall surface of the first dielectric layer; and
   forming a second dielectric layer on the gate electrode and on the first dielectric layer.

2. The method according to claim 1, wherein:
   a top surface of the gate electrode is coplanar with the top surface of the first dielectric layer.

3. The method according to claim 1, wherein:
   the sacrificial layer includes one of an antireflective coating layer and an organic dielectric layer.

4. The method according to claim 1, wherein:
   the protective layer is formed by a chemical vapor deposition process or a physical vapor deposition process.

5. The method according to claim 1, wherein:
   the protective layer is made of one or more of amorphous silicon, amorphous germanium, amorphous silicon germanium, and silicon nitride.

6. The method according to claim 1, wherein:
   a thickness of the protective layer is in a range of approximately from 30 nm to 100 nm.

7. The method according to claim 1, wherein
   the protective layer is removed by a dry etching process or a wet etching process.

8. The method according to claim 1, wherein:
   the sacrificial layer is removed by an ashing process, using one or more of a nitrogen gas and a hydrogen gas.

9. The method according to claim 1, further comprising:
   forming a source/drain doped region on the base substrate on both sides of the opening;
   forming the first dielectric layer covering the source/drain doped region;
   forming a first contact hole in the second dielectric layer and the first dielectric layer, wherein the first contact hole exposes the source/drain doped regions;
   forming a patterned layer in the first contact holes and the second dielectric layer and exposing the second dielectric layer on the gate electrode;
   etching the second dielectric layer using the patterned layer as a mask to form a second contact hole in the second dielectric layer and exposing the gate electrode; and
   removing the patterned layer after forming the second contact hole on the gate electrode.

10. The method according to claim 9, wherein:
    the patterned layer is an antireflective coating layer or an organic dielectric layer.

11. The method according to claim 9, wherein:
    the patterned layer is removed by an ashing process using an oxygen gas.

12. The method according to claim 9, further comprising:
    forming a source/drain plug in the first contact hole; and
    forming a gate plug in the second contact hole.

13. The method according to claim 1, wherein:
    the second dielectric layer is made of silicon oxide.

14. The method according to claim 1, wherein:
    the gate dielectric layer is made of one or more of silicon oxide, $HfO_2$, $La_2O_3$, HfSiON, $HfAlO_2$, $ZrO_2$, $Al_2O_3$ and $HfSiO_4$.

15. The method according to claim 1, wherein:
    a thickness of the sacrificial layer is in a range of approximately from 40 nm to 80 nm.

* * * * *